US012772684B2

(12) United States Patent
Miyamoto

(10) Patent No.: US 12,772,684 B2
(45) Date of Patent: Oct. 20, 2026

(54) DISPLAY DEVICE

(71) Applicant: Sharp Display Technology Corporation, Kameyama City (JP)

(72) Inventor: Tadayoshi Miyamoto, Kameyama City (JP)

(73) Assignee: Sharp Display Technology Corporation, Kameyama City (JP)

( * ) Notice: Subject to any disclaimer, the term of this patent is extended or adjusted under 35 U.S.C. 154(b) by 341 days.

(21) Appl. No.: 18/705,546

(22) PCT Filed: Dec. 29, 2021

(86) PCT No.: PCT/JP2021/049023

§ 371 (c)(1),
(2) Date: Apr. 27, 2024

(87) PCT Pub. No.: WO2023/127165

PCT Pub. Date: Jul. 6, 2023

(65) Prior Publication Data

US 2025/0294980 A1 Sep. 18, 2025

(51) Int. Cl.

*H10K 59/131* (2023.01)
*H10K 59/121* (2023.01)
*H10K 59/124* (2023.01)

(52) U.S. Cl.

CPC ....... *H10K 59/131* (2023.02); *H10K 59/1213* (2023.02); *H10K 59/124* (2023.02)

(58) Field of Classification Search

CPC . H10K 59/1213; H10K 59/124; H10K 59/131
See application file for complete search history.

(56) References Cited

U.S. PATENT DOCUMENTS

2017/0207326 A1 7/2017 Saitoh
2020/0119125 A1* 4/2020 Cho ..................... G09G 3/3233
2020/0243635 A1* 7/2020 Lee ...................... H10K 59/126

FOREIGN PATENT DOCUMENTS

JP 6311900 B2 4/2018

* cited by examiner

*Primary Examiner* — Jacob Y Cho
*Assistant Examiner* — Gabriel Sebastian Minney
(74) *Attorney, Agent, or Firm* — ScienBiziP, P.C.

(57) ABSTRACT

In a frame region closer to a display region than a peripheral circuit is a protective element provided along each display wire. The protective element has the following: a first conductive layer composed of a first semiconductor film made of polysilicon; a third semiconductor layer composed of a second semiconductor film made of an oxide semiconductor, and formed on the first conductive layer with a fifth inorganic insulating film interposed therebetween; and a second conductive layer and a third conductive layer composed of a third metal film, formed so as to be spaced from each other, and electrically connecting the first conductive layer to a first source region and a first drain region.

11 Claims, 8 Drawing Sheets

DISPLAY DEVICE

TECHNICAL FIELD

The disclosure relates to a display device.

BACKGROUND ART

Attention has been recently drawn to self-emission organic EL display devices incorporating organic electroluminescence (hereinafter, also referred to as EL) elements, as display devices alternative to liquid crystal displays. Such an organic EL display device has thin-film transistors (hereinafter, also referred to as "TFTs") provided for each subpixel, which is the minimum unit of an image. Here, well-known examples of a semiconductor layer constituting TFTs include, but not limited to, a semiconductor layer made of high-mobility polysilicon, and a semiconductor layer made of an oxide semiconductor having a small leakage current, such as an In—Ga—Zn—O semiconductor.

For instance, Patent Literature 1 discloses an organic EL display device by way of example, as a display device incorporating a TFT substrate provided with TFTs having an oxide semiconductor layer.

CITATION LIST

Patent Literature

Patent Literature 1: Japanese Patent No. 6311900

SUMMARY

Technical Field

By the way, a high-definition display device provided with a TFT having a semiconductor layer composed of an oxide semiconductor has a possibility that the properties of this oxide semiconductor TFT can deteriorate due to breakage of an insulating film resulting from discharge of static electricity accumulated during a manufacturing process step, and due to moisture entrance from outside.

The disclosure has been made in view of this problem and aims to prevent deterioration in the properties of an oxide-semiconductor thin-film transistor that results from electrostatic discharge and moisture entrance.

Solution to Problem

To achieve the above aim, a display device according to the disclosure includes the following: a base substrate; and a thin-film transistor layer provided on the base substrate, and in which a first semiconductor film composed of polysilicon, a first gate insulating film composed of a first inorganic insulating film, a first metal film, a first interlayer insulating film composed of a second inorganic insulating film, a second semiconductor film composed of an oxide semiconductor, a second gate insulating film composed of a third inorganic insulating film, a second metal film, a second interlayer insulating film composed of a fourth inorganic insulating film, a third metal film, and a flattening film composed of an organic resin material are stacked sequentially. The thin-film transistor layer includes the following: a plurality of display wires composed of the second metal film, and provided so as to extend in parallel with each other; a plurality of intra-pixel thin-film transistors provided in correspondence with a plurality of subpixels constituting a display region; and a plurality of extra-pixel thin-film transistors provided as a peripheral circuit in a frame region around the display region. Each of the plurality of intra-pixel thin-film transistors has a second semiconductor layer composed of the second semiconductor film. Each of the plurality of extra-pixel thin-film transistors has a first semiconductor layer composed of the first semiconductor film. The frame region includes, closer to the display region than the peripheral circuit, a protective element provided along each of the plurality of display wires, and having a first conductive layer, a third semiconductor layer, a second conductive layer, and a third conductive layer. The first conductive layer is composed of the first semiconductor film and is turned into a conductor. The third semiconductor layer is composed of the second semiconductor film and is formed on the first conductive layer with a fifth inorganic insulating film interposed, and the third semiconductor layer has a first source region and a first drain region defined so as to be spaced from each other and has a first channel region defined between the first source region and the first drain region. The second conductive layer and the third conductive layer are composed of the third metal film, are formed so as to be spaced from each other and electrically connect the first conductive layer to the first source region and the first drain region. The first channel region is provided so as to overlap the display wire.

Advantageous Effect of Disclosure

The disclosure can prevent deterioration in the properties of an oxide-semiconductor thin-film transistor that results from electrostatic discharge and moisture entrance.

DESCRIPTION OF EMBODIMENTS

The embodiments of the disclosure will be detailed on the basis of the drawings. It is noted that the disclosure is not limited to the following embodiments.

First Embodiment

Figure 1:
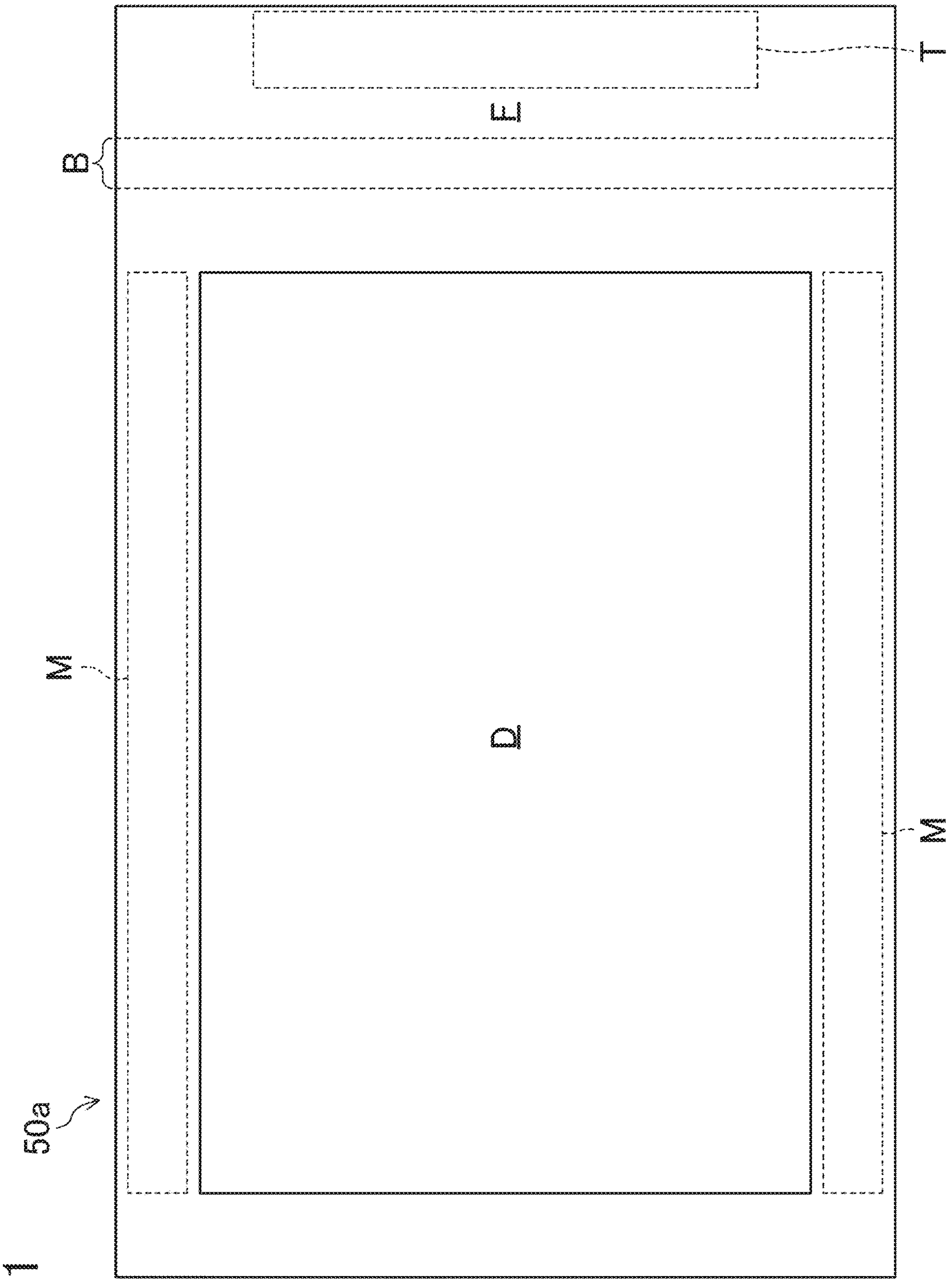
FIG. 1 is a plan view of a schematic configuration of an organic EL display device according to a first embodiment of the disclosure.
Figure 2:
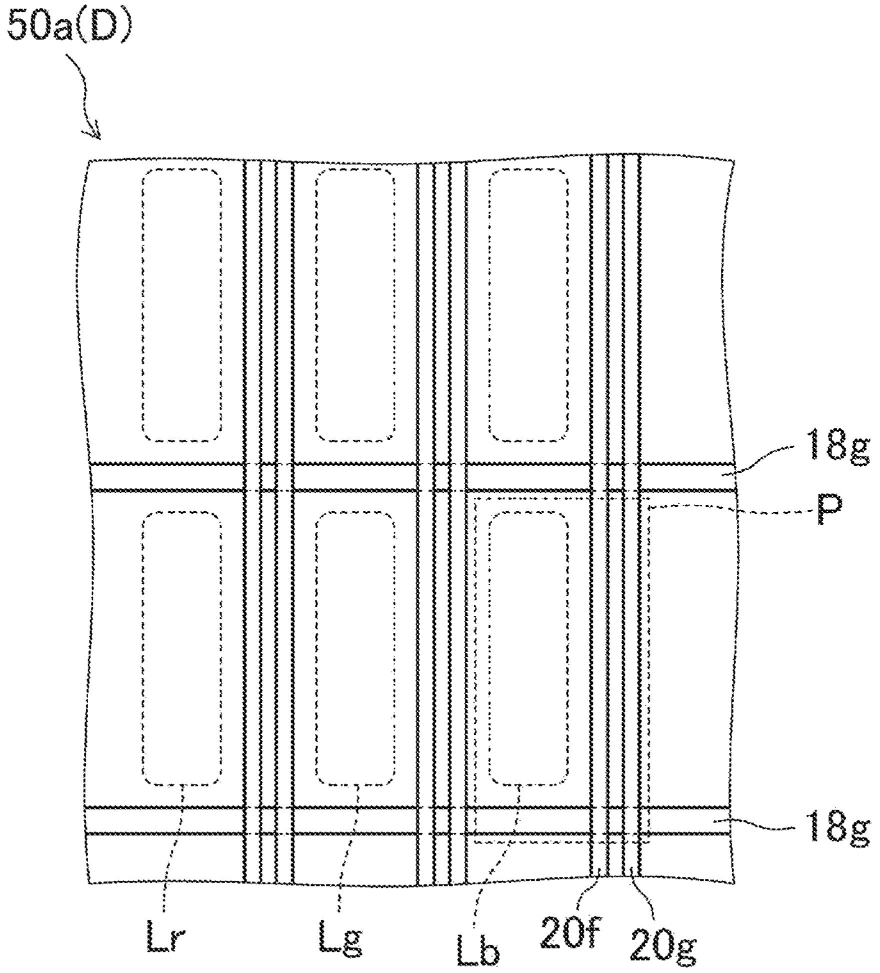
FIG. 2 is a plan view of a display region of the organic EL display device according to the first embodiment of the disclosure.
Figure 3:
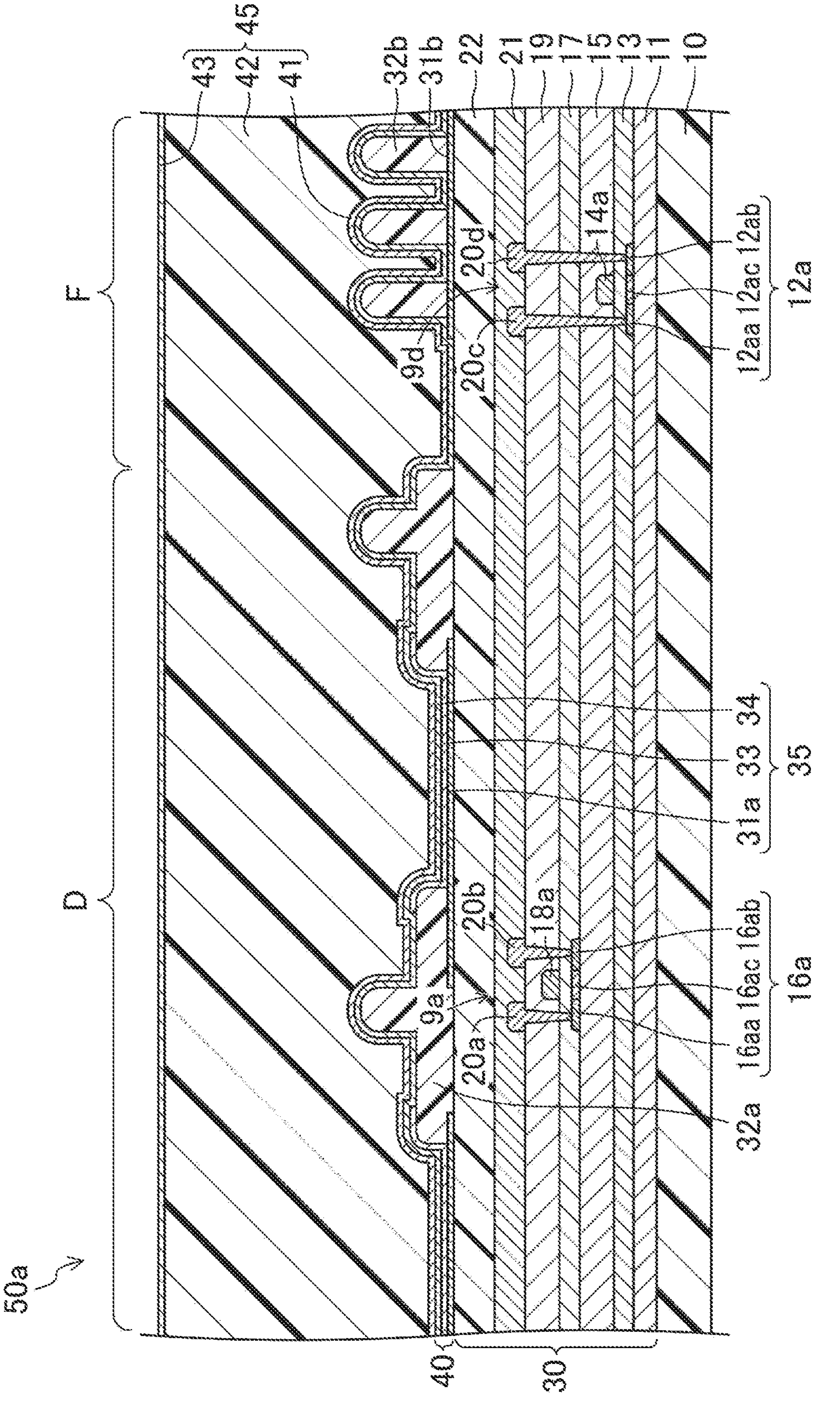
FIG. 3 is a sectional view of the organic EL display device according to the first embodiment of the disclosure.
Figure 4:
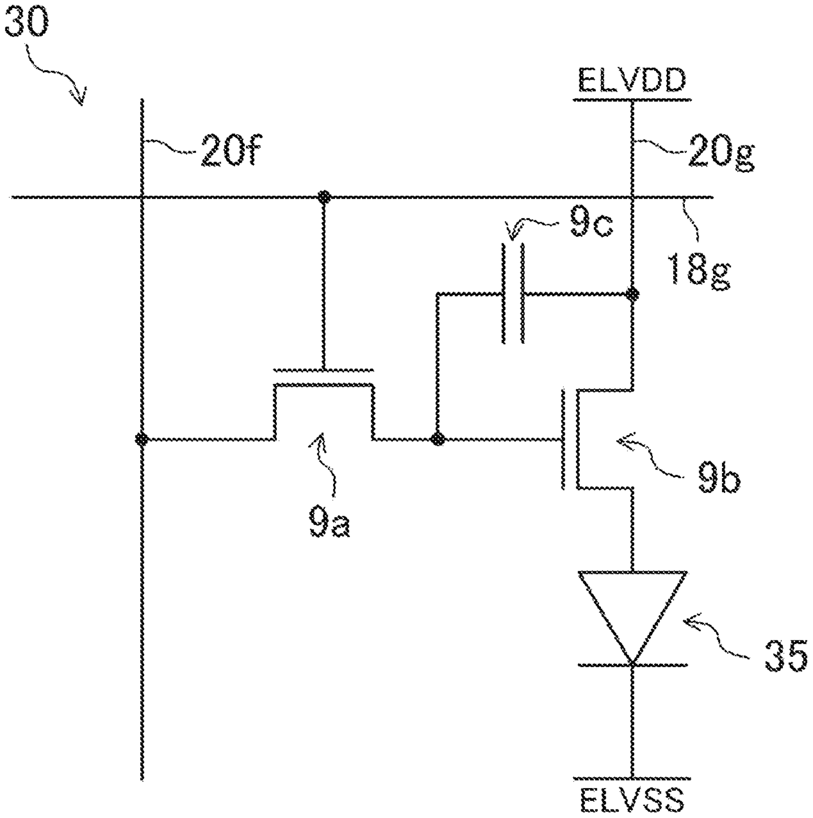
FIG. 4 is an equivalent circuit diagram of a TFT layer constituting the organic EL display device according to the first embodiment of the disclosure.
Figure 5:
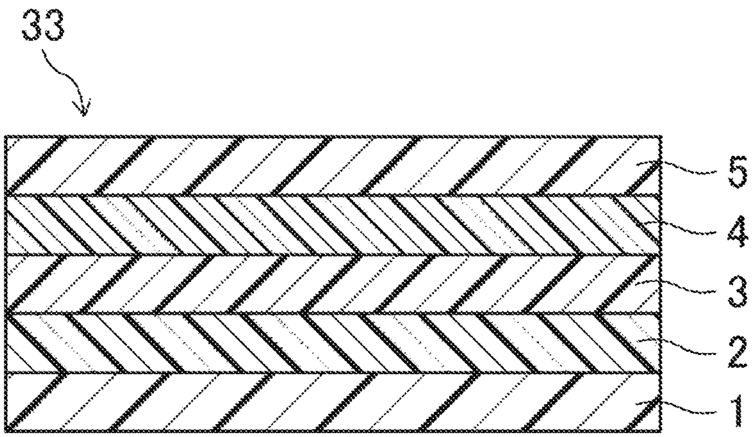
FIG. 5 is a sectional view of an organic EL layer constituting the organic EL display device according to the first embodiment of the disclosure.
Figure 6:
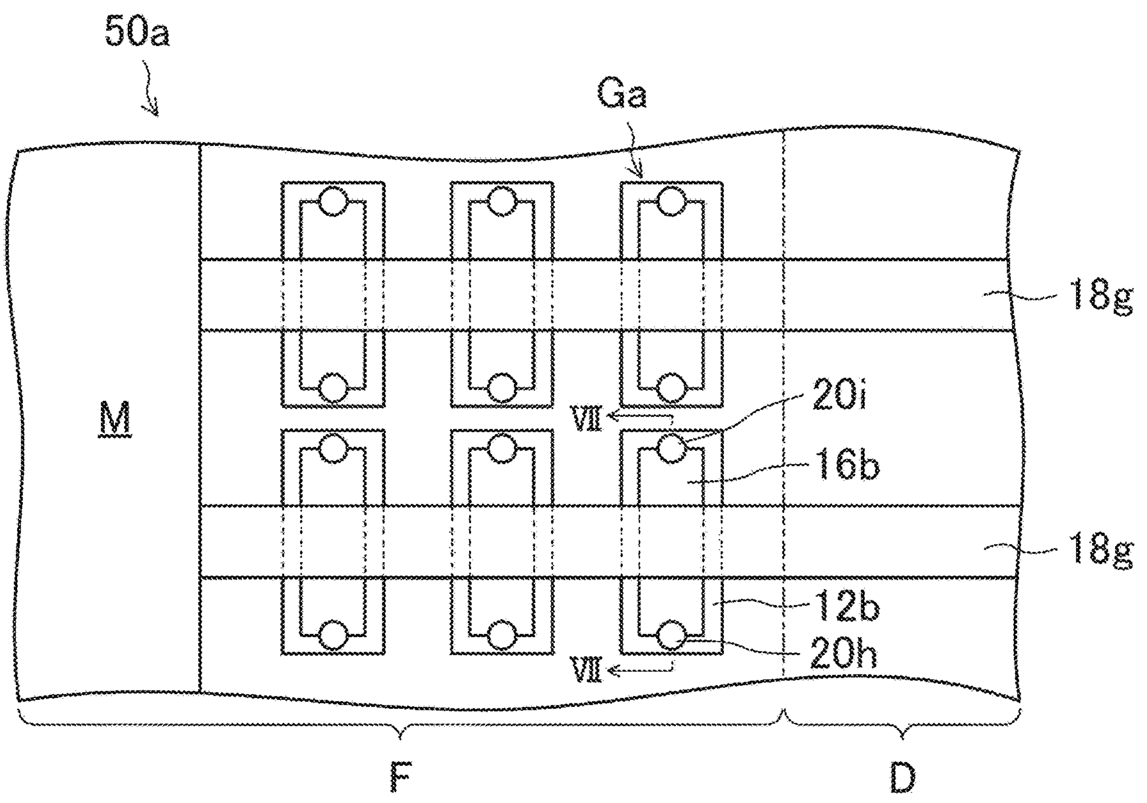
FIG. 6 is a plan view of a region located between a display region of the organic EL display device according to the first embodiment of the disclosure, and a driving circuit in a frame region of the same.
Figure 7:
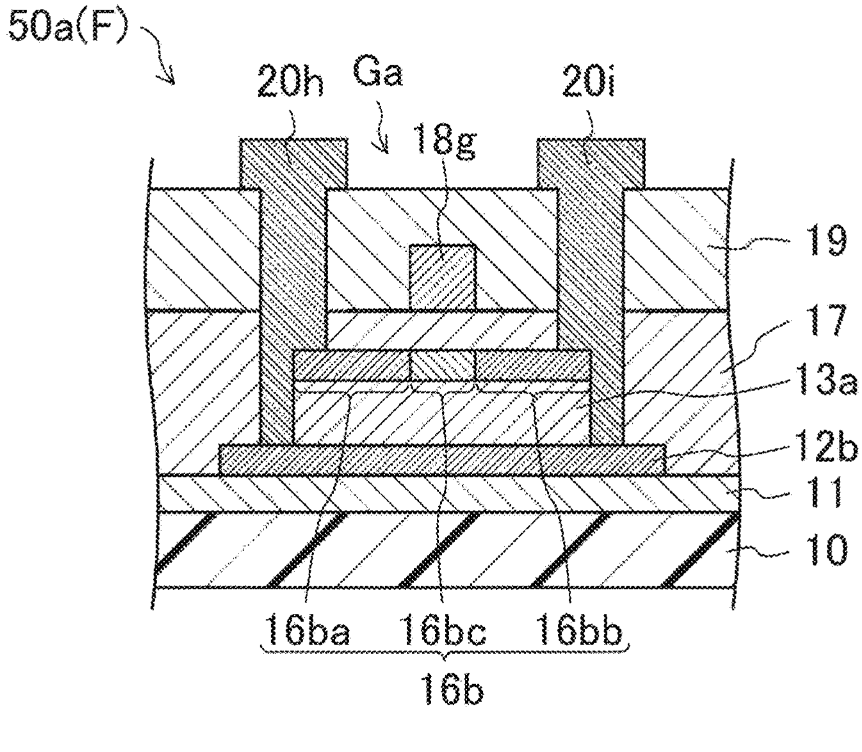
FIG. 7 is a sectional view of the frame region of the organic EL display device taken along line VII-VII in FIG. 6.
Figure 8:
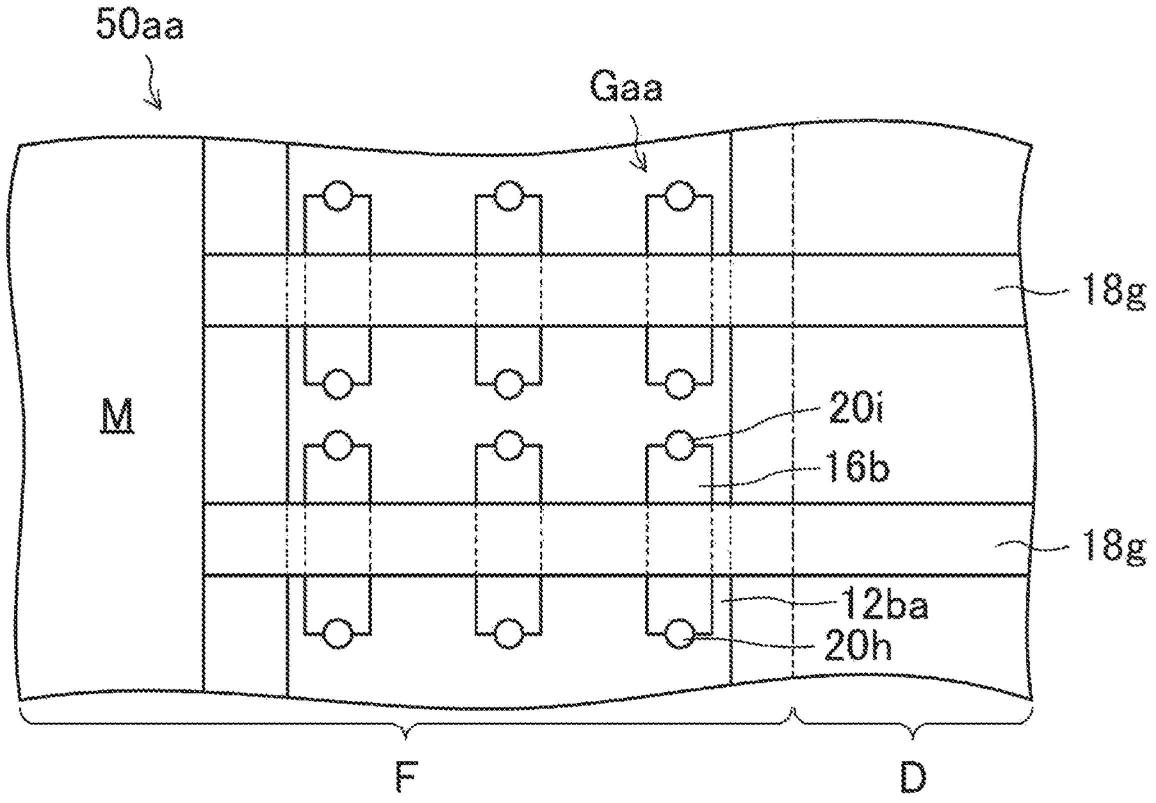
FIG. 8 is a plan view of a region located between the display region of an organic EL display device according to a modification of the first embodiment of the disclosure, and the driving circuit in the frame region of the same.

FIG. 1 to FIG. 8 illustrate a display device according to a first embodiment of the disclosure. It is noted that the following embodiments will describe an organic EL display device including an organic EL element layer by way of example, as a display device including a light-emitting element layer. Here, FIG. 1 is a plan view of a schematic configuration of an organic EL display device 50*a* according to this embodiment. In addition, FIG. 2 is a plan view of a display region D of the organic EL display device 50*a*. In addition, FIG. 3 is a sectional view of the organic EL display device 50*a*. In addition, FIG. 4 is an equivalent circuit diagram of a TFT layer 30 constituting the organic EL display device 50*a*. In addition, FIG. 5 is a sectional view of an organic EL layer 33 constituting the organic EL display device 50*a*. In addition, FIG. 6 is a plan view of a region located between the display region D of the organic EL display device 50*a*, and a driving circuit M in a frame region F of the same. In addition, FIG. 7 is a sectional view of the frame region F of the organic EL display device 50*a* taken along line VII-VII in FIG. 6. In addition, FIG. 8 is a plan view of a region located between the display region D according to a modification (organic EL display device 50*aa*) of the organic EL display device 50*a*, and the driving circuit M in the frame region F of the same.

As illustrated in FIG. 1, the organic EL display device 50*a* has, for instance, the display region D provided in the form of a rectangle and provided for image display, and a frame region F provided in the form of a frame around the display region D. It is noted that although this embodiment describes the rectangular display region D by way of example, this rectangular shape includes substantially rectangular shapes, such as a shape with an arc-shaped side, a shape with an arc-shaped corner, and a shape with part of a side being cut.

The display region D includes a plurality of subpixels P arranged in matrix, as illustrated in FIG. 2. Further, for instance, a subpixel P having a red light-emitting region Lr for red display, a subpixel P having a green light-emitting region Lg for green display, and a subpixel P having a blue light-emitting region Lb for blue display are provided in the display region D so as to be adjacent to one another, as illustrated in FIG. 2. It is noted that the display region D is structured for instance such that three adjacent subpixels P having the red light-emitting region Lr, green light-emitting region Lg, and blue light-emitting region Lb constitute a single pixel.

The frame region F includes a terminal section T provided at the right end in FIG. 1 so as to extend in one direction (the longitudinal direction of the drawing). In addition, between the display region D and the terminal section Tis, as illustrated in FIG. 1, that is, in the frame region F closer to the display region D than the terminal section Tis a bending section B provided so as to extend in one direction (the longitudinal direction of the drawing); here, the bending section B is, for instance, 180° (U-shape) bendable about a bending axis, which is in the longitudinal direction of the drawing. The frame region F also includes the driving circuit M provided as a peripheral circuit at its upper and lower ends in FIG. 1.

The organic EL display device 50*a* includes the following as illustrated in FIG. 3: a resin substrate 10 provided as a base substrate; the TFT layer 30 provided on the resin substrate 10; an organic EL element layer 40 provided as a light-emitting element layer on the TFT layer 30; and a sealing film 45 provided so as to cover the organic EL element layer 40.

The resin substrate 10 is made of, but not limited to, polyimide resin for instance.

The TFT layer 30 includes the following as illustrated in FIG. 3: a base coat film 11 provided on the resin substrate 10; a plurality of first intra-pixel TFTs 9*a* (see FIG. 4), a plurality of second intra-pixel TFTs 9*b*, a plurality of capacitors 9*c* (see FIG. 4), and a plurality of extra-pixel TFTs 9*d* all provided over the base coat film 11; and a protective insulating film 21 and a flattening film 22 provided sequentially over the first intra-pixel TFTs 9*a*, second intra-pixel TFTs 9*b*, capacitors, and extra-pixel TFTs 9*d*. Here, the TFT layer 30 includes, as illustrated in FIG. 2 and FIG. 4, a plurality of gate lines 18*g* provided as display wires so as to extend in parallel with each other in the lateral direction of the drawing. Here, the TFT layer 30 includes, as illustrated in FIG. 2 and FIG. 4, a plurality of gate lines 18*g* provided as display wires so as to extend in parallel with each other in the lateral direction of the drawings. The TFT layer 30 also includes, as illustrated in FIG. 2 and FIG. 4, a plurality of power supply lines 20*g* provided as display wires so as to extend in parallel with each other in the longitudinal direction of the drawings. Moreover, each power supply line 20*g* is provided so as to be adjacent to a corresponding one of the source lines 20*f*, as illustrated in FIG. 2. Further, the TFT layer 30 is structured, as illustrated in FIG. 4, such that each subpixel P is provided with a single first intra-pixel TFT 9*a*, a single second intra-pixel TFT 9*b*, and a single capacitor 9*c*. It is noted that the TFT layer 30 is structured, as illustrated in FIG. 3, such that the base coat film 11, a first semiconductor film that constitutes a first semiconductor layer 12*a*, which will be described later on, a first gate insulating film 13, a first metal film that constitutes second gate electrodes 14*a*, which will be described later on, a first interlayer insulating film 15, a second semiconductor film that constitutes a second semiconductor layer 16*a*, which will be described later on, a second gate insulating film 17, a second metal film that constitutes the gate lines 18*g*, a second interlayer insulating film 19, a third metal film that constitutes the source lines 20*f*, the protective insulating film 21, and the flattening film 22 are stacked sequentially on the resin substrate 10.

The base coat film 11 is composed of an inorganic insulating film that is a monolayer film or multilayer film of a material, such as silicon nitride, silicon oxide, or silicon oxide nitride. Further, the first gate insulating film 13 is composed of a first inorganic insulating film that is a monolayer film or multilayer film of a material, such as silicon nitride, silicon oxide, or silicon oxide nitride. Further, the first interlayer insulating film 15 is composed of a second inorganic insulating film that is a monolayer film or multilayer film of a material, such as silicon nitride, silicon oxide, or silicon oxide nitride. Further, the second gate insulating film 17 is composed of a third inorganic insulating film that is a monolayer film or multilayer film of a material, such as silicon nitride, silicon oxide, or silicon oxide nitride. Further, the second interlayer insulating film 19 is composed of a fourth inorganic insulating film that is a monolayer film or multilayer film of a material, such as silicon nitride, silicon oxide, or silicon oxide nitride. Further, the protective insulating film 21 is composed of a sixth inorganic insulating film that is a monolayer film or multilayer film of a material, such as silicon nitride, silicon oxide, or silicon oxide nitride. Here, at least the first interlayer insulating film 15 adjacent to the second semiconductor layer 16*a*, and the second gate insulating film 17 adjacent to the second semiconductor layer 16*a* are composed of a silicon oxide film.

The first intra-pixel TFT 9*a* in each subpixel P is electrically connected to the corresponding gate line 18*g* and source line 20*f*, as illustrated in FIG. 4. Further, the first intra-pixel TFT 9*a* includes the following as illustrated in FIG. 3: the second semiconductor layer 16*a* provided on the first interlayer insulating film 15; the first gate electrode 18*a* provided on the second semiconductor layer 16*a* with the second gate insulating film 17 interposed therebetween; and a first source electrode 20*a* and a first drain electrode 20*b* provided on the second interlayer insulating film 19 so as to be spaced from each other.

The second semiconductor layer 16*a* is composed of the second semiconductor film made of, for instance, an In—Ga—Zn—O oxide semiconductor, and this layer has the following as illustrated in FIG. 3: a second source region 16*aa* and a second drain region 16*ab* defined so as to be spaced from each other; and a second channel region 16*ac* defined between the second source region 16*aa* and the second drain region 16*ab*. Here, an In—Ga—Zn—O semiconductor is a ternary oxide of indium (In), gallium (Ga), and zinc (Zn) and may contain In, Ga, and Zn at any ratio (composition ratio). Further, this In—Ga—Zn—O semiconductor may be amorphous or crystalline. It is noted that a preferable crystalline In—Ga—Zn—O semiconductor is a crystalline In—Ga—Zn—O semiconductor whose c-axis is nearly perpendicular to a layer surface. It is also noted that other kinds of oxide semiconductor may be contained instead of an In—Ga—Zn—O semiconductor. The other kinds of oxide semiconductor may include an In—Sn—Zn—O semiconductor (e.g., $In_2O_3$—$SnO_2$—ZnO, InSnZnO) for instance. Here, an In—Sn—Zn—O semiconductor is a ternary oxide of indium (In), tin (Sn), and zinc (Zn). Further, the other kinds of oxide semiconductor may include, but not limited to, an In—Al—Zn—O semiconductor, an In—Al—Sn—Zn—O semiconductor, a Zn—O semiconductor, an In—Zn—O semiconductor, a Zn—Ti—O semiconductor, a Cd—Ge—O semiconductor, a Cd—Pb—O semiconductor, cadmium oxide (CdO), a Mg—Zn—O semiconductor, an In—Ga—Sn—O semiconductor, an In—Ga—O semiconductor, a Zr—In—Zn—O semiconductor, a Hf—In—Zn—O semiconductor, an Al—Ga—Zn—O semiconductor, a Ga—Zn—O semiconductor, an In—Ga—Zn—Sn—O semiconductor, $InGaO_3(ZnO)_5$, magnesium zinc oxide ($Mg_xZn_{1-x}O$), and cadmium zinc oxide ($Cd_xZn_{1-x}O$). It is noted that a usable Zn—O semiconductor is an amorphous semiconductor of ZnO with one or more kinds of impurity elements selected from among, but not limited to, a Group I element, a Group XIII element, a Group XIV element, a Group XV element, and a Group XVII element being added thereto, a polycrystalline semiconductor of such ZnO, or a crystallite semiconductor of such ZnO containing amorphous and polycrystalline substances; alternatively, a usable Zn—O semiconductor is a ZnO semiconductor without any impurity elements being added thereto.

The first gate electrode 18*a* is provided so as to overlap the second channel region 16*ac* of the second semiconductor layer 16*a*, as illustrated in FIG. 3, and is configured to control the electrical continuity between the second source region 16*aa* and second drain region 16*ab* of the second semiconductor layer 16*a*. Further, the first gate electrodes 18*a* are composed of the second metal film, like the gate lines 18*g*.

The first source electrode 20*a* and the first drain electrode 20*b* are, as illustrated in FIG. 3, electrically connected to the second source region 16*aa* and second drain region 16*ab* of the second semiconductor layer 16*a*, respectively, via contact holes formed in the second gate insulating film 17 and second interlayer insulating film 19. Further, the first source electrodes 20*a* and the first drain electrodes 20*b* are composed of the third metal film, like the source lines 20*f* and the power supply lines 20*g*.

The second intra-pixel TFT 9*b* in each subpixel P is electrically connected to the corresponding first intra-pixel TFT 9*a* and power supply line 20*g*, as illustrated in FIG. 4. Further, the second intra-pixel TFT 9*b* includes, like the foregoing first intra-pixel TFT 9*a*, the second semiconductor layer (16*a*), the first gate electrode (18*a*), the first source electrode (20*a*), and the first drain electrode (20*b*).

The capacitor 9*c* in each subpixel P is electrically connected to the corresponding first intra-pixel TFT 9*a* and power supply line 20*g*, as illustrated in FIG. 4. Here, the capacitor 9*c* includes, for example, a lower conductive layer composed of the second metal film, an upper conductive layer composed of the third metal film, and the second interlayer insulating film 19 provided between the lower conductive layer and the upper conductive layer. It is noted that the upper conductive layer is electrically connected to the power supply line 20*g* via a contact hole formed in the second interlayer insulating film 19.

The flattening film 22 has a flat surface in the display region D and is composed of, but not limited to, an organic resin material, such as polyimide resin.

As illustrated in FIG. 3, the organic EL element layer 40 includes the following sequentially stacked in correspondence with the plurality of subpixels P: a plurality of first electrodes 31*a*; an edge cover 32*a* that is shared; a plurality of organic EL layers 33; and a second electrode 34 that is shared. Here, the first electrode 31*a*, organic EL layer 33, and second electrode 34 in each subpixel P constitute an organic EL element 35 (see FIG. 4).

The first electrodes 31*a* are electrically connected to the first drain electrodes 20*b* of the second intra-pixel TFTs 9*b* in the respective subpixels P via contact holes formed in the protective insulating film 21 and flattening film 22. Further, the first electrodes 31*a* have the function of injecting holes (positive holes) into the organic EL layers 33. Further, the first electrodes 31*a* are more desirably formed using a material having a large work function, in order to improve the efficiency of hole injection into the organic EL layers 33. Here, the first electrodes 31*a* are made of, for instance, a metal material, such as silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), or tin (Sn). Further, the first electrodes 31*a* may be made of, for instance, alloy of astatine (At) and astatine oxide ($AtO_2$) or other combinations. Furthermore, the first electrodes 31*a* may be made of, but not limited to, a conductive oxide, such as tin oxide (SnO), zinc oxide (ZnO), indium tin oxide (ITO), or indium zinc oxide (IZO). Further, the first electrodes 31*a* may be formed by stacking multiple layers made of the above materials. It is noted that examples of a compound material having a large work function include indium tin oxide (ITO) and indium zinc oxide (IZO).

The edge cover 32*a* is composed of, but not limited to, an organic resin material, such as polyimide resin or acrylic resin, or a polysiloxane spin-on-glass (SOG) material. Here, as illustrated in FIG. 3, a part of the surface of the edge cover 32*a* protrudes upward in the drawing to constitute pixel photo-spacers provided in the form of islands.

The organic EL layers 33 are provided as light-emitting functional layers, and as illustrated in FIG. 5, each organic EL layer 33 includes a hole injection layer 1, a hole transport layer 2, a light-emitting layer 3, an electron transport layer 4, and an electron injection layer 5 sequentially stacked on the first electrode 31*a*.

The hole injection layer 1 is also called an anode buffer layer and has the function of bringing the energy levels of the first electrode 31*a* and organic EL layer 33 close to each other to improve the efficiency of hole injection from the first electrode 31*a* into the organic EL layer 33. Here, examples of the material of the hole injection layer 1 include a triazole derivative, an oxadiazole derivative, an imidazole derivative, a polyarylalkane derivative, a pyrazoline derivative, a phenylenediamine derivative, an oxazole derivative, a styrylanthracene derivative, a fluorenone derivative, a hydrazone derivative, and a stilbene derivative.

The hole transport layer 2 has the function of improving the efficiency of hole transport from the first electrode 31*a* to the organic EL layer 33. Here, examples of the material of the hole transport layer 2 include a porphyrin derivative, an aromatic tertiary amine compound, a styrylamine derivative, polyvinylcarbazole, poly-p-phenylenevinylene, polysilane, a triazole derivative, an oxadiazole derivative, an imidazole derivative, a polyarylalkane derivative, a pyrazoline derivative, a pyrazolone derivative, a phenylenediamine derivative, an arylamine derivative, an amine-substituted chalcone derivative, an oxazole derivative, a styrylanthracene derivative, a fluorenone derivative, a hydrazone derivative, a stilbene derivative, hydrogenated amorphous silicon, hydrogenated amorphous silicon carbide, zinc sulfide, and zinc selenide.

The light-emitting layer 3 is a region where holes and electrons are respectively injected from the first electrode 31*a* and second electrode 34 applied with voltage, and where the holes and electrons recombine together. Here, the light-emitting layer 3 is made of a material having high efficiency of light emission. Moreover, examples of the material of the light-emitting layer 3 include a metal oxinoid compound [8-hydroxyquinoline metal complex], a naphthalene derivative, an anthracene derivative, a diphenylethylene derivative, a vinyl acetone derivative, a triphenylamine derivative, a butadiene derivative, a coumarin derivative, a benzoxazole derivative, an oxadiazole derivative, an oxazole derivative, a benzimidazole derivative, a thiadiazole derivative, a benzothiazole derivative, a styryl derivative, a styrylamine derivative, a bisstyrylbenzene derivative, a trisstyrilbenzene derivative, a perylene derivative, a perynone derivative, an aminopyrene derivative, a pyridine derivative, a rhodamine derivative, an acridine derivative, phenoxazone, a quinacridone derivative, rubrene, poly-p-phenylenevinylene, and polysilane.

The electron transport layer 4 has the function of moving electrons to the light-emitting layer 3 efficiently. Here, an example of the material of the electron transport layer 4 is organic compounds, including an oxadiazole derivative, a triazole derivative, a benzoquinone derivative, a naphthoquinone derivative, an anthraquinone derivative, a tetracyanoanthraquinodimethane derivative, a diphenoquinone derivative, a fluorenone derivative, a silole derivative, and a metal oxinoid compound.

The electron injection layer 5 has the function of bringing the energy levels of the second electrode 34 and organic EL layer 33 close to each other to improve the efficiency of electron injection from the second electrode 34 into the organic EL layer 33. This function can lower a voltage for driving the organic EL element 35. It is noted that the electron injection layer 5 is also called a cathode buffer layer. Here, examples of the material of the electron injection layer 5 include inorganic alkali compounds, such as lithium fluoride (LiF), magnesium fluoride ($MgF_2$), calcium fluoride ($CaF_2$), strontium fluoride ($SrF_2$), or barium fluoride ($BaF_2$), as well as aluminum oxide ($Al_2O_3$) and strontium oxide (SrO).

The second electrode 34 is shared among all the subpixels P so as to cover the individual organic EL layers 33 and the edge cover 32*a*, as illustrated in FIG. 3. Further, the second electrode 34 has the function of injecting electrons into the organic EL layers 33. Further, the second electrode 34 is more desirably made of a material having a small work function, in order to improve the efficiency of electron injection into the organic EL layers 33. Here, examples of the material of the second electrode 34 include silver (Ag), aluminum (Al), vanadium (V), calcium (Ca), titanium (Ti), yttrium (Y), sodium (Na), manganese (Mn), indium (In), magnesium (Mg), lithium (Li), ytterbium (Yb), and lithium fluoride (LiF). Further, the second electrode 34 may be made of, for instance, alloy of magnesium (Mg) and copper (Cu), alloy of magnesium (Mg) and silver (Ag), alloy of sodium (Na) and potassium (K), alloy of astatine (At) and astatine oxide ($AtO_2$), alloy of lithium (Li) and aluminum (Al), alloy of lithium (Li), calcium (Ca) and aluminum (Al), or alloy of lithium fluoride (LiF), calcium (Ca) and aluminum (Al). Further, the second electrode 34 may be composed of a conductive oxide, such as tin oxide (SnO), zinc oxide (ZnO), indium tin oxide (ITO), or indium zinc oxide (IZO). Further, the second electrode 34 may be formed by stacking multiple layers made of the above materials. It is noted that examples of a material having a small work function include magnesium (Mg), lithium (Li), lithium fluoride (LiF), magnesium (Mg)-copper (Cu), magnesium (Mg)-silver (Ag), sodium (Na)-potassium (K), lithium (Li)-aluminum (Al), lithium (Li)-calcium (Ca)-aluminum (Al), and lithium fluoride (LiF)-calcium (Ca)-aluminum (Al).

As illustrated in FIG. 3, the sealing film 45 is provided so as to cover the second electrode 34 and includes a first inorganic sealing film 41, an organic sealing film 42, and a second inorganic sealing film 43 sequentially stacked on the second electrode 34, and the sealing film 45 has the function of protecting the organic EL layers 33 of the organic EL elements 35 from moisture, oxygen, and other things. Here, the first inorganic sealing film 41 and the second inorganic sealing film 43 are composed of an inorganic insulating film, such as a silicon nitride film, a silicon oxide film, or a silicon oxide nitride film. Further, the organic sealing film 42 is made of an organic resin material, such as acrylic resin, epoxy resin, silicone resin, polyurea resin, parylene resin, polyimide resin, or polyamide resin.

As illustrated in FIG. 3, the organic EL display device 50*a* also includes, in the frame region F, a plurality of peripheral photo-spacers 32*b* provided in the form of islands on the flattening film 22 with a conductive layer 31*b* interposed therebetween, so as to protrude upward in the drawing. Here, the individual peripheral photo-spacers 32*b* are formed in the same layer using the same material as the edge cover 32*a*. Further, the conductive layer 31*b* is formed in the same layer using the same material as the first electrodes 31*a*.

The organic EL display device 50*a* also includes the plurality of extra-pixel TFTs 9*d* provided in the frame region F so as to constitute the driving circuits M, as illustrated in FIG. 3.

The extra-pixel TFTs 9*d* each include the following as illustrated in FIG. 3: the first semiconductor layer 12*a* provided on the base coat film 11; the second gate electrode 14*a* provided on the first semiconductor layer 12*a* with the first gate insulating film 13 interposed therebetween; and a second source electrode 20*c* and a second drain electrode 20*d* provided on the second interlayer insulating film 19 so as to be spaced from each other.

The first semiconductor layer 12*a* is composed of polysilicon, such as low-temperature polysilicon (LTPS), and this layer has the following as illustrated in FIG. 3: a third source region 12*aa* and a third drain region 12*ab* defined so as to be spaced from each other; and a third channel region 12*ac* defined between the third source region 12*aa* and the third drain region 12*ab*.

The second gate electrode 14*a* is provided so as to overlap the third channel region 12*ac* of the first semiconductor layer 12*a*, as illustrated in FIG. 3, and is configured to control the electrical continuity between the third source region 12*aa* and third drain region 12*ab* of the first semiconductor layer 12*a*. Further, the second gate electrodes 14*a* are composed of the first metal film.

As illustrated in FIG. 3, the second source electrode 20*c* and the second drain electrode 20*d* are electrically connected to the third source region 12*aa* and third drain region 12*ab* of the first semiconductor layer 12*a*, respectively, via contact holes formed in the first gate insulating film 13, first interlayer insulating film 15, second gate insulating film 17, and second interlayer insulating film 19. Further, the second source electrodes 20*c* and the second drain electrodes 20*b* are composed of the third metal film, like the source lines 20*f*, the power supply lines 20*g*, the first source electrodes 20*a*, and the first drain electrodes 20*b*.

As illustrated in FIG. 6, the organic EL display device 50*a* also includes a plurality of protective elements Ga provided along each gate line 18*g* in the frame region F closer to the display region D than the driving circuits M.

The protective elements Ga each include the following as illustrated in FIG. 6 and FIG. 7: a first conductive layer 12*b* provided on the base coat film 11; a third semiconductor layer 16*b* provided on the first conductive layer 12*b* with a fifth inorganic insulating film 13*a* interposed therebetween; and a second conductive layer 20*h* and a third conductive layer 20*i* provided on the second interlayer insulating film 19 so as to be spaced from each other.

The first conductive layer 12*b* is composed of the first semiconductor film, and the layer is doped with impurity ions to be thus turned into a conductor. Here, the first conductive layer 12*b* is provided in such a manner that, as illustrated in FIG. 7, a portion electrically connected to the second conductive layer 20*h*, and a portion electrically connected to the third conductive layer 20*i* are integrated together so as to overlap a first channel region 16*ac*, which will be described later on.

The fifth inorganic insulating film 13*a* is composed of a monolayer film or multilayer film of a material, such as silicon nitride, silicon oxide, or silicon oxide nitride; to be specific, the fifth inorganic insulating film 13*a* is formed in the same layer using the same material as the first gate insulating film 13. It is noted that although this embodiment describes, by way of example, a configuration where the fifth inorganic insulating film 13*a* formed in the same layer using the same material as the first gate insulating film 13 is placed between the first conductive layer 12*b* and the third semiconductor layer 16*b*, the fifth inorganic insulating film 13*a* between the first conductive layer 12*b* and third semiconductor layer 16*b* may be formed in the same layer using the same material as the first interlayer insulating film 15.

The third semiconductor layer 16*b* is composed of the second semiconductor film, like the second semiconductor layer 16*a*, and as illustrated in FIG. 7, the third semiconductor layer 16*b* has a first source region 16*ba* and a first drain region 16*bb* defined so as to be spaced from each other, and the first channel region 16*bc* defined between the first source region 16*ba* and the first drain region 16*bb*. Here, the first channel region 16*bc* is provided so as to overlap the corresponding gate line 18*g*, as illustrated in FIG. 7.

As illustrated in FIG. 7, the second conductive layer 20*h* and the third conductive layer 20*i* are configured to electrically connect the first conductive layer 12*b* and the first source region 16*ba* together, and the first conductive layer 12*b* and the first drain region 16*bb* together, respectively, via contact holes formed in the second gate insulating film 17 and second interlayer insulating film 19. Further, the second conductive layer 20*h* and the third conductive layer 20*i* are composed of the third metal film, like the source lines 20*f*, the power supply lines 20*g*, the first source electrodes 20*a*, and the first drain electrodes 20*b*.

The protective elements Ga with the foregoing configuration are each configured to accumulate static electricity in the fifth inorganic insulating film 13*a*, disposed between the first conductive layer 12*b* and the first source region 16*ba* as well as the first drain region 16*bb*, when, for instance, such static electricity accumulated along each gate line 18*g*, which is a relatively long line extending across the display region D, enters from the second conductive layer 20*h* and third conductive layer 20*i*, provided as lightning rods. Here, the protective elements Ga, each of which is not electrically connected to an element that contributes to the actual operation of the organic EL display device 50*a*, are configured not to affect the actual operation of the organic EL display device 50*a* even if the protective elements Ga themselves are broken by static electricity. The protective elements Ga, which are structures that can physically block moisture entering along each gate line 18*g*, are configured to prevent moisture entrance from outside into the display region D.

It is noted that this embodiment has described, by way of example, the organic EL display device 50*a* provided with the protective elements Ga; in another embodiment, an organic EL display device 50*aa* illustrated in FIG. 8 may be used that is provided with protective elements Gaa.

To be specific, the protective elements Gaa in the organic EL display device 50*aa* each include the following as illustrated in FIG. 8: a first conductive layer 12*ba* provided on the base coat film 11; the third semiconductor layer 16*b* provided on the first conductive layer 12*ba* with the fifth inorganic insulating film 13*a* (see FIG. 7) interposed therebetween; and the second conductive layer 20*h* and the third conductive layer 20*i* provided on the second interlayer insulating film 19 (see FIG. 7) so as to be spaced from each other. Here, the first conductive layer 12*ba* is provided in the form of a strip shared among the plurality of protective elements, as illustrated in FIG. 8. The organic EL display device 50*aa* can accumulate much static electricity, because the fifth inorganic insulating film 13*a*, disposed between the first conductive layer 12*ba* and the first source region 16*ba* as well as the first drain region 16*bb*, has a large electric capacity. It is noted that the first conductive layer 12*ba* may be grounded.

The organic EL display device 50*a* also includes, in the frame region F, a first dam wall provided in the form of a frame so as to surround the display region D, and a second dam wall provided in the form of a frame around the first dam wall. Here, the first dam wall and the second dam wall each include, for instance, a lower resin layer formed in the same layer using the same material as the flattening film 22, and an upper resin layer provided on the lower resin layer, and formed in the same layer using the same material as the edge cover 32*a*. It is noted that the first dam wall is provided so as to overlap the outer periphery end of the organic sealing film 42 of the sealing film 45 and is configured to prevent the spread of an ink that constitutes the organic sealing film 42.

The foregoing organic EL display device 50*a* is configured to display an image through the following process in each subpixel P: a gate signal is input to the first intra-pixel TFT 9*a* via the gate line 18*g* to turn on the first intra-pixel TFT 9*a*; a data signal is written into the first gate electrode 18*a* and capacitor 9*c* of the second intra-pixel TFT 9*b* via the source line 20*f*; and a current coming from the power supply line 20*g* and corresponding to the gate voltage of the second intra-pixel TFT 9*b* is supplied to the organic EL layer 33, so that the light-emitting layer 3 of the organic EL layer 33 emits light. It is noted that in the organic EL display device 50*a*, the light-emitting layer 3 continues to emit light until a gate signal in the next frame is input, because the capacitor 9*c* retains the gate voltage of the second intra-pixel TFT 9*b* even when the first intra-pixel TFT 9*a* is turned off.

Next, a method for manufacturing the organic EL display device 50*a* according to this embodiment will be described. Here, the method for manufacturing the organic EL display device 50*a* according to this embodiment includes a step of forming a TFT layer, a step of forming an organic EL element layer, and a step of forming a sealing film.

Step of Forming TFT Layer

The first process step is forming the base coat film 11 by forming a silicon nitride film (about 50 nm thick) and a silicon oxide film (about 250 nm thick) sequentially onto the resin substrate 10 formed on a glass substrate through, for instance, plasma chemical vapor deposition (CVD).

The next is forming an amorphous silicon film (about 50 nm thick) onto the substrate surface with the base coat film 11 formed thereon, through, for instance, plasma CVD, and crystallizing the amorphous silicon film through laser annealing or other methods to thus form a first semiconductor film made of polysilicon, followed by patterning the first semiconductor film to thus form the first semiconductor layer 12*a* and the other first semiconductor layer (12*b*).

The next is forming a silicon oxide film (about 100 nm thick) onto the substrate surface with the first semiconductor layer 12*a* and other components formed thereon, through, for instance, plasma CVD, followed by patterning the silicon oxide film metal to thus form the first gate insulating film 13 and the fifth inorganic insulating film 13*a*.

The next is forming a first metal film, such as a molybdenum film (about 200 nm thick), onto the substrate surface with the first gate insulating film 13 and other components formed thereon, through, for instance, sputtering, followed by patterning the first metal film to thus form the second gate electrode 14*a*.

The next is doping the first semiconductor layer 12*a* and the other first semiconductor layer (12*b*) with impurity ions by the use of the second gate electrode 14*a* as a mask, to thus turn part of the first semiconductor layer 12*a* and the other first semiconductor layer (12*b*) into conductors, thus forming the third source region 12*aa*, third drain region 12*ab*, and third channel region 12*ac* in the first semiconductor layer 12*a*, and forming the first conductive layer 12*b*.

The next is forming a silicon nitride film (about 150 nm thick) and a silicon oxide film (about 100 nm thick) sequentially onto the substrate surface with part of the first semiconductor layer 12*a* and other components turned into conductors, through, for instance, plasma CVD to thus form the first interlayer insulating film 15.

The next is forming a second semiconductor film made of an oxide semiconductor, such as an $InGaZnO_4$ film (about 30 nm thick), onto the substrate surface with the first interlayer insulating film 15 formed thereon, through, for instance, sputtering, followed by patterning the second semiconductor film to thus form the second semiconductor layer 16*a* and the third semiconductor layer 16*b*.

The next is forming a silicon oxide film (about 100 nm thick) onto the substrate surface with the second semiconductor layer 16*a* and other components formed thereon, through, for instance, plasma CVD to thus form the second gate insulating film 17.

The next is forming a second metal film, such as a molybdenum film (about 200 nm thick), onto the substrate surface with the second gate insulating film 17 formed thereon, through, for instance, sputtering, followed by patterning the second metal film to thus form the first gate electrode 18*a*, the gate line 18*g* and other components.

The next is forming a silicon oxide film (about 300 nm thick) and a silicon nitride film (about 150 nm thick) onto the substrate surface with the first gate insulating film 18*a* and other components formed thereon, through, for instance, plasma CVD to thus form the second interlayer insulating film 19. It is noted that part of the second semiconductor layer 16*a* and part of the third semiconductor layer 16*b* are turned into conductors through heating after the second interlayer insulating film 19 is formed, thus forming the second source region 16*aa*, second drain region 16*ab*, and second channel region 16*ac* in the second semiconductor layer 16*a*, and forming the first source region 16*ba*, first drain region 16*bb*, and first channel region 16*bc* in the third semiconductor layer 16*b*.

The next is subjecting the first gate insulating film 13, first interlayer insulating film 15, second gate insulating film 17, and second interlayer insulating film 19 to patterning as appropriate on the substrate surface with the second interlayer insulating film 19 formed thereon, to thus form a contact hole. Here, the plurality of protective elements G, which are provided along each gate line 18*g*, can prevent an electrostatic breakdown in the frame region F closer to the display region D than the driving circuits M (corresponding to the vicinity of the end of a long wire, which is typically susceptible to an electrostatic breakdown) even though patterning through dry etching is performed for forming the contact hole.

The next is forming a titanium film (about 50 nm thick), an aluminum film (about 400 nm thick), and a titanium film (about 200 nm thick) sequentially onto the substrate surface with the contact hole formed therein, through, for instance, sputtering to thus form a third metal film, followed by patterning the third metal film to thus form the first source electrode 20*a*, the first drain electrode 20*b*, the second source electrode 20*c*, the second drain electrode 20*d*, the source line 20*f*, the power supply line 20*g*, the second conductive layer 20*h*, the third conductive layer 20*i*, and other components.

The next is forming a silicon oxide film (about 250 nm thick) onto the substrate surface with the first source electrode 20*a* and other components formed thereon, through, for instance, plasma CVD to thus form the protective insulating film 21.

The next is applying a photosensitive acrylic resin film (about 2 μm thick) onto the substrate surface with the protective insulating film 21 formed thereon, through, for instance, spin coating or slit coating, followed by subjecting the applied film to pre-baking, exposure, development, and post-baking to thus form the flattening film 22 having a contact hole.

The final process step is removing the protective insulating film 21 exposed from the contact hole of the flattening film 22, so that the contact hole reaches the second drain electrode 20*d* of the second intra-pixel TFT 9*b*.

The TFT layer 30 can be formed through the foregoing process steps.

Step of Forming Organic EL Element Layer

The organic EL element layer 40 is formed by forming, through a well-known method, the first electrodes 31*a*, the edge cover 32*a*, the organic EL layers 33 (the hole injection layer 1, the hole transport layer 2, the light-emitting layer 3, the electron transport layer 4, and the electron injection layer 5), and the second electrode 34 onto the flattening film 22 of the TFT layer 30 formed in the step of forming the TFT layer.

Step of Forming Sealing Film

The first process step is forming an inorganic insulating film, such as a silicon nitride film, a silicon oxide film, or a silicon oxide nitride film, onto the substrate surface on which the organic EL element layer 40 formed in the step of forming the organic EL element layer is formed, through plasma CVD using a mask, to thus form the first inorganic sealing film 41.

The next is forming a film of an organic resin material, such as acrylic resin, onto the substrate surface with the first inorganic sealing film 41 formed thereon, through, for instance, ink-jet printing to thus form the organic sealing film 42.

The next is forming an inorganic insulating film, such as a silicon nitride film, a silicon oxide film, or a silicon oxide nitride film, onto the substrate with the organic sealing film 42 formed thereon, through plasma CVD using a mask, to thus form the second inorganic sealing film 43, thereby forming the sealing film 45.

The final process step is attaching a protective sheet (not shown) to the substrate surface with the sealing film 45 formed thereon, followed by laser light irradiation light from near the glass substrate of the resin substrate 10 to thus remove the glass substrate from the lower surface of the resin substrate 10, followed by attaching another protective sheet (not shown) to the lower surface of the resin substrate 10 with the glass substrate removed therefrom.

The organic EL display device 50*a* according to this embodiment can be manufactured through the foregoing process steps.

As described above, the organic EL display device 50*a* according to this embodiment includes the plurality of protective elements Ga provided along each of the gate lines 18*g* in the frame region F closer to the display region D than the driving circuit M. Here, the protective elements Ga each include the following: the first conductive layer 12*b* provided on the base coat film 11; the third semiconductor layer 16*b* provided on the first conductive layer 12*b* with the fifth inorganic insulating film 13*a* interposed therebetween; and the second conductive layer 20*h* and the third conductive layer 20*i* provided on the second interlayer insulating film 19 so as to be spaced from each other, and the protective elements Ga are each configured to accumulate static electricity in the fifth inorganic insulating film 13*a*, disposed between the first conductive layer 12*b* and the first source region 16*ba* as well as the first drain region 16*bb*, when such static electricity accumulated along each gate line 18*g* enters from the second conductive layer 20*h* and the third conductive layer 20*i*. The protective elements Ga, which are structures that can physically block moisture entering along each gate line 18*g*, are also configured to prevent moisture entrance from outside into the display region D. This can prevent deterioration in the properties of the first intra-pixel TFT 9*a* and second intra-pixel TFT 9*b*, both composed of an oxide semiconductor, that results from electrostatic discharge and moisture entrance.

Second Embodiment

Figure 9:
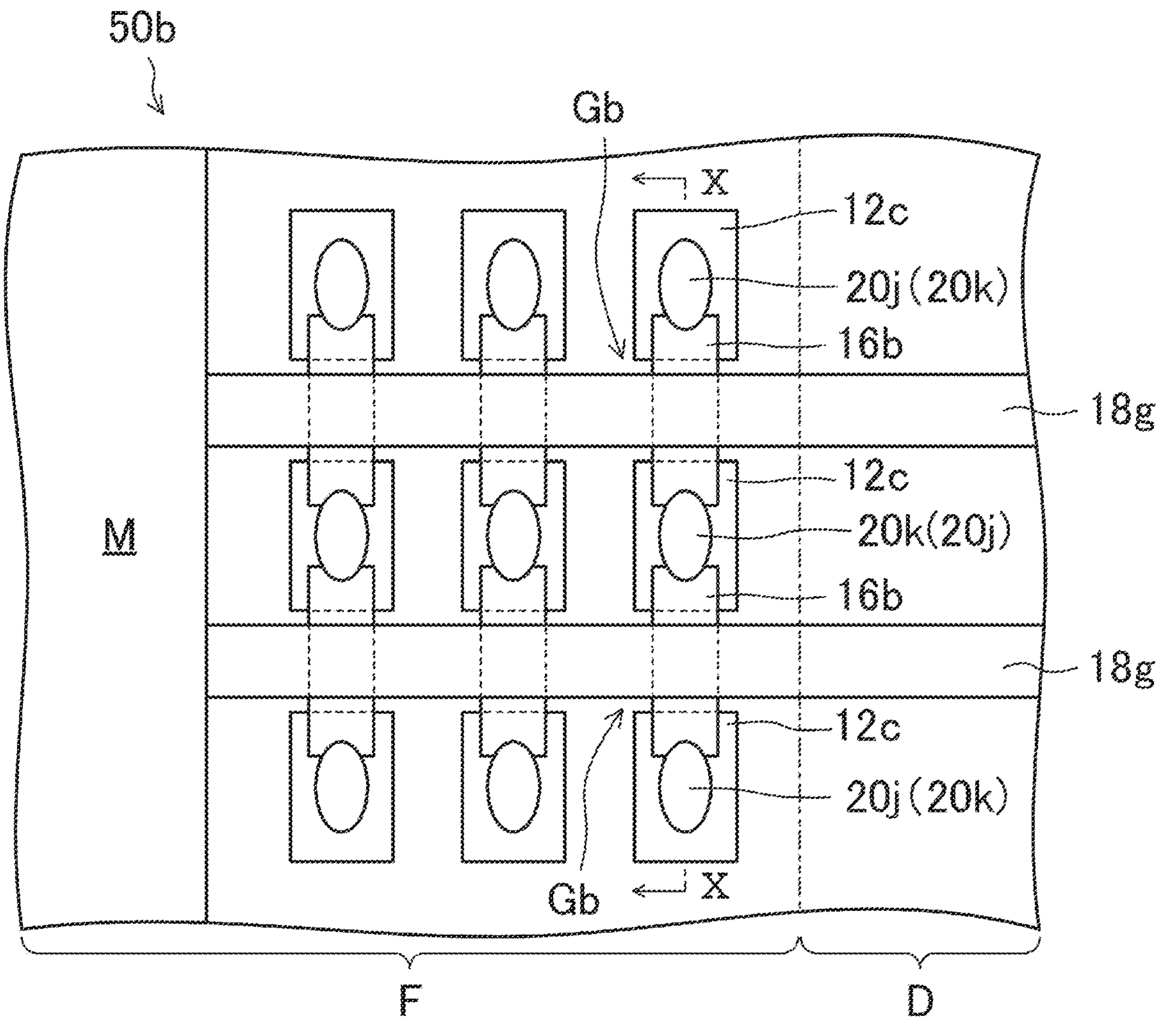
FIG. 9 is a plan view of a region located between the display region of an organic EL display device according to a second embodiment of the disclosure, and the driving circuit in the frame region of the same.
Figure 10:
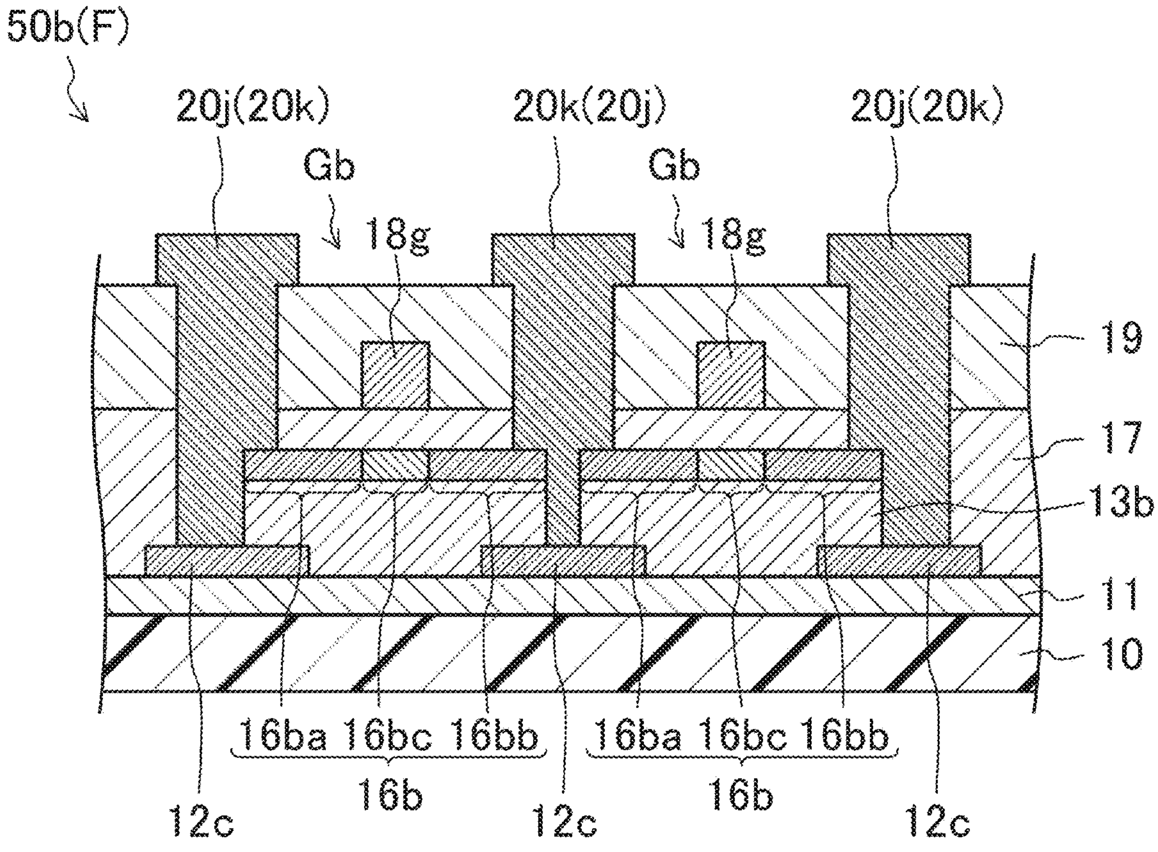
FIG. 10 is a sectional view of the frame region of the organic EL display device taken along line X-X in FIG. 9.

FIG. 9 and FIG. 10 illustrate a display device according to a second embodiment of the disclosure. Here, FIG. 9 is a plan view of a region located between the display region D of an organic EL display device 50*b* according to this embodiment, and the driving circuit M in the frame region F of the same. In addition, FIG. 10 is a sectional view of the frame region F of the organic EL display device 50*b* taken along line X-X in FIG. 9. It is noted that the same components as those illustrated in FIG. 1 to FIG. 8 will be denoted by the same signs in the following embodiment, and their detailed description will be omitted.

The first embodiment has described, by way of example, the organic EL display device 50*a* where the protective elements Ga are provided in the frame region F closer to the display region D than the driving circuit M. This embodiment will describe the organic EL display device 50*b* where protective elements Gb are provided in the frame region F closer to the display region D than the driving circuit M.

Like the organic EL display device 50*a* according to the first embodiment, the organic EL display device 50*b* has the display device D provided in the form of a rectangle, and the frame region F provided in the form of a frame around the display region D.

Like the organic EL display device 50*a* according to the first embodiment, the organic EL display device 50*b* also includes the resin substrate 10, the TFT layer 30 provided on the resin substrate 10, the organic EL element layer 40 provided on the TFT layer 30, and the sealing film 45 provided so as to cover the organic EL element layer 40.

Like the organic EL display device 50*a* according to the first embodiment, the organic EL display device 50*b* also includes, in the frame region F, a plurality of peripheral photo-spacers 32*b*, a plurality of extra-pixel TFTs 9*d*, a first dam wall, and a second dam wall.

As illustrated in FIG. 9, the organic EL display device 50*b* also includes the plurality of protective elements Gb provided along each gate line 18*g* in the frame region F closer to the display region D than the driving circuit M.

The protective elements Gb each include the following as illustrated in FIG. 9 and FIG. 10: a pair of first conductive layers 12*c* provided on the base coat film 11; the third semiconductor layer 16*b* provided on the pair of first conductive layers 12*c* with a fifth inorganic insulating film 13*b* interposed therebetween; and a second conductive layer 20*j* and a third conductive layer 20*k* provided on the second interlayer insulating film 19 so as to be spaced from each other.

The first conductive layers 12*c* are composed of a first semiconductor film, and the layers are doped with impurity ions to be thus turned into conductors. Here, the first conductive layers 12*c* are provided in a pair separated into a side electrically connected to the second conductive layer 20*j* and a side electrically connected to the third conductive layer 20*k*, as illustrated in FIG. 9 and FIG. 10.

The fifth inorganic insulating film 13*b* is composed of a monolayer film or multilayer film of a material, such as silicon nitride, silicon oxide, or silicon oxide nitride; to be specific, the fifth inorganic insulating film 13*b* is formed in the same layer using the same material as the first gate insulating film 13.

As illustrated in FIG. 9 and FIG. 10, the second conductive layer 20*j* and the third conductive layer 20*k* are configured to electrically connect the pair of first conductive layers 12*c* to the first source region 16*ba* and first drain region 16*bb* via contact holes formed in the second gate insulating film 17 and second interlayer insulating film 19. Further, the second conductive layer 20*j* and the third conductive layer 20*k* are composed of a third metal film, like the source lines 20*f*, the power supply lines 20*g*, the first source electrodes 20*a*, and the first drain electrodes 20*b*.

Here, as illustrated in FIG. 9, each protective element Gb provided along one of a pair of adjacent gate lines 18*g*, and each protective element Gb provided along the other one of the pair of adjacent gate lines 18*g* are disposed so as to be adjacent to each other in a direction (the longitudinal direction of the drawing) intersecting with (orthogonal to) the pair of adjacent gate lines 18*g*. Moreover, the protective elements Gb adjacent to each other in a pair in the direction orthogonal to the pair of adjacent gate lines 18*g* share the second conductive layer 20*j* and the third conductive layer 20*k*, and these protective elements Gb share the first conductive layer 12*c* electrically connected to the second conductive layer 20*j*, and the first conductive layer 12*c* electrically connected to the third conductive layer 20*k*. It is noted that, of the plurality of first conductive layers 12*c* provided in the direction intersecting with (orthogonal to) the pair of gate lines 18*g*, the first conductive layer 12*c* at the distal end located the closest to the substrate end is grounded.

When, for instance, static electricity accumulated along each gate line 18*g*, which is a relatively long line extending across the display region D, enters from the second conductive layer 20*j* and third conductive layer 20*k*, provided as lightning rods, thus applying, to the gate line 18*g*, a voltage equal to or greater than a threshold for operating the TFTs, the protective elements Gb with the foregoing configuration are each configured to establish electrical continuity between the first source region 16*ba* and the first drain region 16*bb*, thus establishing electrical continuity between the second conductive layer 20*j* and the third conductive layer 20*k* via the third semiconductor layer 16*b* to thus eliminate, via the first conductive layer 12*c* at the distal end, the static electricity entered the second conductive layer 20*j* and third conductive layer 20*k*. Here, the protective elements Gb, each of which is not electrically connected to an element that contributes to the actual operation of the organic EL display device 50*b*, are configured not to affect the actual operation of the organic EL display device 50*b*. The protective elements Gb, which are structures that can physically block moisture entering along each gate line 18*g*, are also configured to prevent moisture entrance from outside into the display region D.

Like the organic EL display device 50*a* according to the first embodiment, the organic EL display device 50*b* with the foregoing configuration is flexible and is configured such that in each subpixel P, the light-emitting layer 3 of the organic EL layer 33 emits light as appropriate via the first intra-pixel TFT 9*a* and the second intra-pixel TFT 9*b*, so that the organic EL display device 50*b* displays an image.

The organic EL display device 50*b* according to this embodiment can be manufactured by changing the pattern shapes of the first conductive layer 12*b*, second conductive layer 20*h*, and third conductive layer 20*i* in the step of forming the TFT layer of the method for manufacturing the organic EL display device 50*a* according to the first embodiment.

As described above, the organic EL display device 50*b* according to this embodiment includes the plurality of protective elements Gb provided along each of the gate lines 18*g* in the frame region F closer to the display region D than the driving circuit M. Here, the protective elements Gb each include the following: the pair of first conductive layers 12*c* provided on the base coat film 11; the third semiconductor layer 16*b* provided on the pair of first conductive layers 12*c* with the fifth inorganic insulating film 13*b* interposed therebetween; and the second conductive layer 20*j* and the third conductive layer 20*k* provided on the second interlayer insulating film 19 so as to be spaced from each other. Moreover, when static electricity accumulated along each gate line 18*g* enters from the second conductive layer 20*j* and third conductive layer 20*k*, provided as lightning rods, thus applying, to the gate line 18*g*, a voltage equal to or greater than a threshold, the protective elements Gb are each configured to establish electrical continuity between the first source region 16*ba* and the first drain region 16*bb*, thus establishing electrical continuity between the second conductive layer 20*j* and the third conductive layer 20*k* via the third semiconductor layer 16*b* to thus eliminate, via the first conductive layer 12*c* at the distal end, the static electricity entered the second conductive layer 20*j* and third conductive layer 20*k*. The protective elements Gb, which are structures that can physically block moisture entering along each gate line 18*g*, are also configured to prevent moisture entrance from outside into the display region D. This can prevent deterioration in the properties of the first intra-pixel TFT 9*a* and second intra-pixel TFT 9*b*, both composed of an oxide semiconductor, that results from electrostatic discharge and moisture entrance.

Other Embodiments

Although the foregoing embodiments have each described, by way of example, an organic EL layer of five-ply stacked structure composed of a hole injection layer, a hole transport layer, a light-emitting layer, an electron transport layer, and an electron injection layer, the organic EL layer may be of, for instance, three-ply stacked structure composed of a hole injection-and-transport layer, a light-emitting layer, and an electron transport-and-injection layer.

Further, although the foregoing embodiments have each described, by way of example, an organic EL display device having a first electrode as an anode, and a second electrode as a cathode, the disclosure is also applicable to an organic EL display device with the stacked structure of its organic EL layer being inverted: a first electrode as a cathode, and a second electrode as an anode.

Further, although the foregoing embodiments have each described, by way of example, an organic EL display device in which a TFT's electrode connected to the first electrode constitutes a drain electrode, the disclosure is also applicable to an organic EL display device in which a TFT's electrode connected to the first electrode constitutes a source electrode.

Further, although the foregoing embodiments have each described an organic EL display device as a display device by way of example, the disclosure is applicable to a display device provided with a plurality of light-emitting elements that are driven by current; for instance, the disclosure is applicable to a display device provided with quantum-dot light-emitting diodes (QLEDs), which are light-emitting elements having a quantum-dot-containing layer.

INDUSTRIAL APPLICABILITY

As described above, the disclosure is useful for high-definition small display devices for use in, but not limited to, head mounted display (HMD).

The invention claimed is:

1. A display device comprising:

a base substrate; and a thin-film transistor layer provided on the base substrate, and in which a first semiconductor film composed of polysilicon, a first gate insulating film composed of a first inorganic insulating film, a first metal film, a first interlayer insulating film composed of a second inorganic insulating film, a second semiconductor film composed of an oxide semiconductor, a second gate insulating film composed of a third inorganic insulating film, a second metal film, a second interlayer insulating film composed of a fourth inorganic insulating film, a third metal film, and a flattening film composed of an organic resin material are stacked sequentially, the thin-film transistor layer including a plurality of display wires composed of the second metal film, and provided so as to extend in parallel with each other, a plurality of intra-pixel thin-film transistors provided in correspondence with a plurality of subpixels constituting a display region, and a plurality of extra-pixel thin-film transistors provided as a peripheral circuit in a frame region around the display region, each of the plurality of intra-pixel thin-film transistors having a second semiconductor layer composed of the second semiconductor film, each of the plurality of extra-pixel thin-film transistors having a first semiconductor layer composed of the first semiconductor film, wherein the frame region includes, closer to the display region than the peripheral circuit, a protective element provided along each of the plurality of display wires, and having a first conductive layer, a third semiconductor layer, a second conductive layer, and a third conductive layer, the first conductive layer being composed of the first semiconductor film and being turned into a conductor, the third semiconductor layer being composed of the second semiconductor film and being formed on the first conductive layer with a fifth inorganic insulating film interposed, the third semiconductor layer having a first source region and a first drain region defined so as to be spaced from each other, and having a first channel region defined between the first source region and the first drain region, the second conductive layer and the third conductive layer being composed of the third metal film, being formed so as to be spaced from each other, and electrically connecting the first conductive layer to the first source region and the first drain region, and the first channel region is provided so as to overlap the display wire.

2. The display device according to claim 1, wherein the first conductive layer is provided in such a manner that a portion electrically connected to the second conductive layer, and a portion electrically connected to the third conductive layer are integrated together so as to overlap the first channel region.

3. The display device according to claim 2, wherein a plurality of the protective elements are provided along each of the plurality of display wires, and the first conductive layer is shared among the plurality of protective elements.

4. The display device according to claim 1, wherein the first conductive layer is separated into a side electrically connected to the second conductive layer, and a side electrically connected to the third conductive layer.

5. The display device according to claim 4, wherein a plurality of the protective elements are provided along each of the plurality of display wires, each of the plurality of protective elements provided along one of a pair of adjacent display wires, and each of the plurality of protective elements provided along another of the pair of adjacent display wires are disposed so as to be adjacent to each other in a direction intersecting with the pair of adjacent display wires, the pair of adjacent display wires being included in the plurality of display wires, the protective elements adjacent to each other in a pair share the second conductive layer and the third conductive layer and share the first conductive layer electrically connected to the second conductive layer, and the first conductive layer electrically connected to the third conductive layer, and the first conductive layer is grounded.

6. The display device according to claim 1, wherein each of the plurality of intra-pixel thin-film transistors includes the second semiconductor layer having a second source region and a second drain region defined so as to be spaced from each other, a first gate electrode composed of the second metal film, and provided on the second semiconductor layer with the second gate insulating film interposed, and a first source electrode and a first drain electrode composed of the third metal film, provided on the second interlayer insulating film so as to be spaced from each other, and electrically connected to the second source region and the second drain region, respectively.

7. The display device according to claim 1, wherein each of the plurality of extra-pixel thin-film transistors includes the first semiconductor layer having a third source region and a third drain region defined so as to be spaced from each other, a second gate electrode composed of the first metal film, and provided on the first semiconductor layer with the first gate insulating film interposed, and a second source electrode and a second drain electrode composed of the third metal film, provided on the second interlayer insulating film so as to be spaced from each other, and electrically connected to the third source region and the third drain region, respectively.

8. The display device according to claim 1, wherein each of the plurality of display wires is a gate line.

9. The display device according to claim 1, wherein a protective insulating film composed of a sixth inorganic insulating film is provided between the third metal film and the flattening film.

10. The display device according to claim 1, comprising:

a light-emitting element layer provided on the thin-film transistor layer, with a plurality of first electrodes, a plurality of light-emitting functional layers, and a second electrode that is shared being stacked sequentially in correspondence with the plurality of subpixels; and a sealing film provided so as to cover the light-emitting element layer.

11. The display device according to claim 10, wherein each of the plurality of light-emitting functional layers is an organic electroluminescence layer.

* * * * *